United States Patent [19]
Nagai

[11] Patent Number: 5,329,177
[45] Date of Patent: Jul. 12, 1994

[54] OUTPUT CIRCUIT INCLUDING CURRENT MIRROR CIRCUITS

[75] Inventor: Nobutaka Nagai, Tokyo, Japan
[73] Assignee: Nec Corporation, Tokyo, Japan
[21] Appl. No.: 51,566
[22] Filed: Apr. 26, 1993
[30] Foreign Application Priority Data
 Apr. 27, 1992 [JP] Japan .................................. 4-107200
[51] Int. Cl.⁵ ...................... H03K 17/16; H03K 19/20
[52] U.S. Cl. ..................................... 307/451; 307/443
[58] Field of Search ......................... 307/451, 443, 475
[56] References Cited
U.S. PATENT DOCUMENTS

| | | | |
|---|---|---|---|
| 4,694,201 | 9/1987 | Jason ................................... | 307/451 |
| 4,752,703 | 6/1988 | Lin ...................................... | 307/451 |
| 5,039,886 | 8/1991 | Nakamura .......................... | 307/451 |
| 5,128,561 | 7/1992 | Montegari ........................... | 307/451 |
| 5,162,673 | 11/1992 | Ohi ..................................... | 307/451 |

Primary Examiner—Edward P. Westin
Assistant Examiner—Andrew Sanders
Attorney, Agent, or Firm—Young & Thompson

[57] ABSTRACT

The invention provides an output circuit in a semiconductor integrated circuit which comprises an input terminal for receiving input signals controlling output circuits, an output terminal for delivering output signals driving a load device being connected to the output terminal, high and low voltage supply lines for supplying high and low voltage driving the output circuit, a first current mirror circuit on its output stage including a single transistor being connected between the high voltage supply line and the output terminal, a second current mirror circuit on its output stage including a single transistor being connected between the low voltage supply line and the output terminal, a first logic circuit being connected between the input terminal and the first current mirror circuit for receiving input signals from the input terminal for a subsequent controlling of the first current mirror circuit, and a second logic circuit being connected between the input terminal and the second current mirror circuit for receiving input signals from the input terminal for a subsequent controlling of the second current mirror circuit.

6 Claims, 3 Drawing Sheets

OUTPUT CIRCUIT INCLUDING CURRENT MIRROR CIRCUITS

BACKGROUND OF THE INVENTION

The invention relates to an output circuit in a semiconductor integrated circuit, and more particularly to an output circuit having current mirror circuits in a semiconductor integrated circuit.

One of the most importance for circuit design of semiconductor integrated circuits is an improvement in high integration of the semiconductor integrated circuits. Indeed, the importance of high integration of the semiconductor integrated circuits is on the increase. As the output circuits are involved in the semiconductor integrated circuits, a minimization of the output circuit and thus a reduction of a occupied area by the output circuit are essential to improve the high integration of the semiconductor integrated circuits.

A typical circuit structure of the conventional output circuit, particularly an output circuit which exhibits a controllable output current will be described with reference to FIG. 1. The conventional output circuit is formed between a high potential side power supply line 1 and a low potential side ground line 3 so as to drive the output circuit by a power which is supplied from a power supply through the high potential side power supply line 1. The output circuit has a signal input terminal 2 which receives input digital signals and an output terminal 4 through which output signals are delivered. The output circuit includes a p-type MOS transistor P1, an n-type MOS transistor N1 and first and second current mirror circuits 5 and 6. The circuit structure of the output circuit may be regarded as a modification of the CMOS circuit structure wherein the p-type and n-type MOS transistors are connected to the output terminal 4 through the first and second current mirror circuits 5 and 6.

Thus, the p-type MOS transistor P1 which serves as a switching device is arranged at a high potential side in the output circuit. More particularly, the p-type MOS transistor P1 is connected at its source side to the high potential side power supply line 1 which supply a power to the output circuit. The p-type MOS transistor P1 is further connected at its drain side to the first current mirror circuit 5. The p-type MOS transistor P1 is further connected at its gate electrode to the signal input terminal 2 which receives digital input signals so as to exhibit a high speed switching operation based upon digital input signals which are transmitted to the gate electrode of the p-type MOS transistor P1 through the signal input terminal 2. When the gate electrode of the p-type MOS transistor P1 receives the high level signal, the p-type MOS transistor P1 takes OFF state. If the gate electrode of the p-type MOS transistor P1 receives the low level signal, the p-type MOS transistor P1 takes ON state.

The n-type MOS transistor N1 which also serves as a switching device is arranged but at a low potential side in the output circuit. The n-type MOS transistor N1 is connected at its source side to the ground line which supply the ground potential to the output circuit. The n-type MOS transistor N1 is further connected at its drain side to the second current mirror circuit 6. The n-type MOS transistor N1 is further connected at its gate electrode to the signal input terminal 2 which receives digital input signals so as to exhibit a high speed switching operation based upon digital input signals which are transmitted to the gate electrode of the n-type MOS transistor N1 through the signal input terminal 2. When the gate electrode of the n-type MOS transistor N1 receives the high level signal, the n-type MOS transistor N1 takes ON state. If the gate electrode of the n-type MOS transistor N1 receives the low level signal, the n-type MOS transistor N1 takes OFF state.

The first current mirror circuit 5 is arranged between the p-type MOS transistor P1 serving as a switching device and the output terminal 4. The first current mirror circuit 5 includes an n-type transistor N51 and p-type transistors P52 and P53. The p-type MOS transistor P53 is arranged on an output stage in the first current mirror circuit 5. The p-type MOS transistor P53 is connected at its source side to the drain side of the p-type MOS switching transistor P1. The p-type MOS transistor P53 is also connected at its drain side to the output terminal 4. The p-type MOS transistor P53 and the p-type MOS transistor P52 are connected to each other through those gate electrodes and source sides respectively. The p-type MOS transistor P52 and the n-type MOS transistor N51 are connected to each other through those drain sides. The p-type MOS transistor P52 has a short circuit connection between its gate and drain sides. The n-type MOS transistor N51 is grounded at its source side. The gate electrode of the n-type MOS transistor N51 receives a constant voltage $V_{RP}$. The n-type MOS transistor N51 serves as a current source. The p-type MOS transistor P52 controls a source-drain current of the p-type MOS transistor P53 so that the respective source-drain currents of the p-type MOS transistors P1 and P53 are approximately proportional to each other. The ratio of the respective source-drain currents of the p-type MOS transistors P52 and P53 is defined by the ratio of channel widths thereof.

The second current mirror circuit 6 is arranged between the n-type MOS transistor N1 serving as a switching device and the output terminal 4. The second current mirror circuit 6 includes a p-type transistor P61 and n-type transistors N62 and N63. The n-type MOS transistor N63 is arranged on an output stage in the second current mirror circuit 6. The n-type MOS transistor N63 is connected at its source side to the drain side of the n-type MOS switching transistor N1. The n-type MOS transistor N63 is also connected at its drain side to the output terminal 4. The n-type MOS transistor N63 and the n-type MOS transistor N62 are connected to each other through those gate electrodes and source sides respectively. The n-type MOS transistor N62 and the p-type MOS transistor P61 are connected to each other through those drain sides. The n-type MOS transistor N62 has a short circuit connection between its gate and drain sides. The p-type MOS transistor P61 is connected to a high potential side power supply line which supplies a high voltage $V_{DD}$. The gate electrode of the p-type MOS transistor P61 receives a constant voltage $V_{RN}$. The p-type MOS transistor P61 serves as a current source. The n-type MOS transistor N62 controls a source-drain current of the n-type MOS transistor N63 so that the respective source-drain currents of the n-type MOS transistors N1 and N63 are approximately proportional to each other. The ratio of the respective source-drain currents of the n-type MOS transistors N62 and N63 is defined by the ratio of channel widths thereof.

Such conventional output circuit is, however, engaged with the following disadvantages. As described above, the p-type MOS transistors P1 and P53 are connected in series on the output stage in the output circuit in the semiconductor integrated circuits. The n-type MOS transistors N1 and N63 are also connected in series on the output stage in the output circuit. It appears that a relatively large source-drain current flows through either the p-type MOS transistors P1 and P53 or the n-type MOS transistors N1 and N63. Namely, it is required that the source-drain currents of the p-type MOS transistor P1 and P53 are the same. Similarly, it is required that the source-drain currents of the n-type MOS transistors N1 and N63 are the same. That is why it is required to so design both the p-type MOS transistors P1 and P53 as to have the same channel size and thus the same channel width and length. Of course, the n-type MOS transistors N1 and N63 are so designed as to have the same channel size.

Further, as described above, the p-type transistor P53 and P52 respectively exhibit source-drain currents which are proportional to each other. Thus, the p-type transistor P53 and P52 respectively are designed as to have channel widths which are proportional to each other. The ratio of the source-drain currents of the p-type MOS transistors P52 and P53 is defined by the ratio of the channel widths thereof. It is required for a high speed driving of a load that either the p-type MOS transistor P53 or n-type MOS transistor N63 on the output stage has an extremely large source-drain current as compared to the source-drain current of the p-type MOS transistor P52. This results in that the channel widths of both the p-type and n-type MOS transistors P53 and N63 are also extremely large as compared to the channel widths of the p-type and n-type MOS transistors P52 and N62. The transistors P53 and N63 on the output stage of the output circuit are forced to have an extremely large size as compared to the transistors P52 and N62 in logic circuits. Physically, the MOS transistors P52 and N62 has a small channel width no more than 10 micrometers to 20 micrometers. In contrast, both the p-type transistors P1 and P53 are required to have extremely large channel widths of approximately 2500 micrometers and large channel lengths of approximately 3 micrometers. The n-type MOS transistors N1 and N63 are also required to have extremely large channel widths of approximately 1250 micrometers and large channel lengths of approximately 3 micrometers. Each of the transistors P1, N1, P53 and P63 on the output stage in the output circuit requires an extremely large occupied area as compared to the other transistors in the logic circuit in the output circuit.

It is therefore necessary to improve a high integration and thus to minimize a occupied area of the output circuit involved in the semiconductor integrated circuits. Scaling down of each of the transistors on the output stage in the output circuit is difficult due to the requirement of those large source-drain current. Thus, a reduction of the number of transistors on the output stage in the output circuit is essential to improve a high integration of the output circuit and thus to minimize the occupied area of the output circuit.

It is, therefore, required to develop a novel output circuit which is so designed as to reduce the number of transistors having an extremely large occupied area arranged on the output circuits.

SUMMARY OF THE INVENTION

Accordingly, it is a primary object of the present invention to provide a novel output circuit structure involved in a semiconductor integrated circuit.

It is a further object of the present invention to provide a novel output circuit structure which requires a small occupied area in a semiconductor integrate circuit.

It is a still further object of the present invention to provide a novel output circuit structure including a small number of transistors arranged on an output stage.

The above and other objects, features and advantages of the present invention will be apparent from the following descriptions.

The present invention provides an output circuit in a semiconductor integrated circuit which comprises an input terminal for receiving input signals controlling output circuits, an output terminal for delivering output signals driving an load device being connected to the output terminal, high and low voltage supply lines for supplying high and low voltage driving the output circuit, a first current mirror circuit on its output stage including a single transistor being connected between the high voltage supply line and the output terminal, a second current mirror circuit on its output stage including a single transistor being connected between the low voltage supply line and the output terminal, a first logic circuit being connected between the input terminal and the first current mirror circuit for receiving input signals from the input terminal for a subsequent controlling of the first current mirror circuit, and a second logic circuit being connected between the input terminal and the second current mirror circuit for receiving input signals from the input terminal for a subsequent controlling of the second current mirror circuit.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

The present invention provides a novel output circuit including two transistors arranged on an output stage of the output circuit. The number of the transistors on the output stage of the output circuit is reduced to a half of that of the conventional output circuit.

Figure 1:
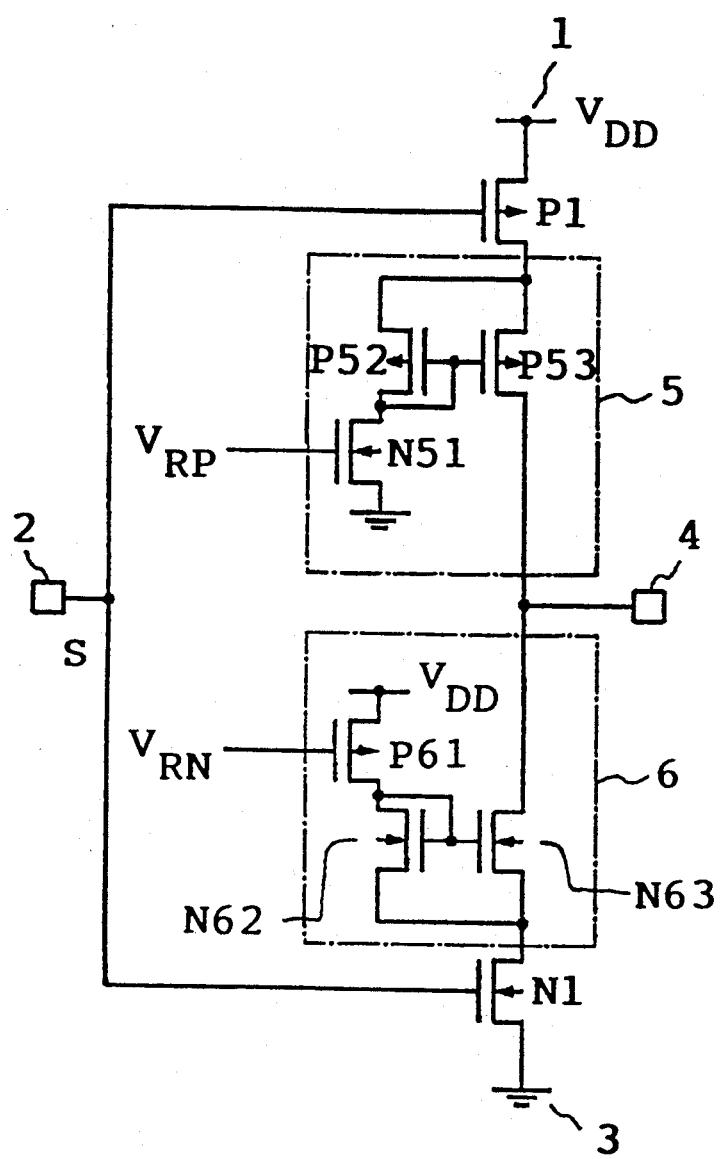
FIG. 1 is a circuit diagram of the conventional output circuit.
Figure 2:
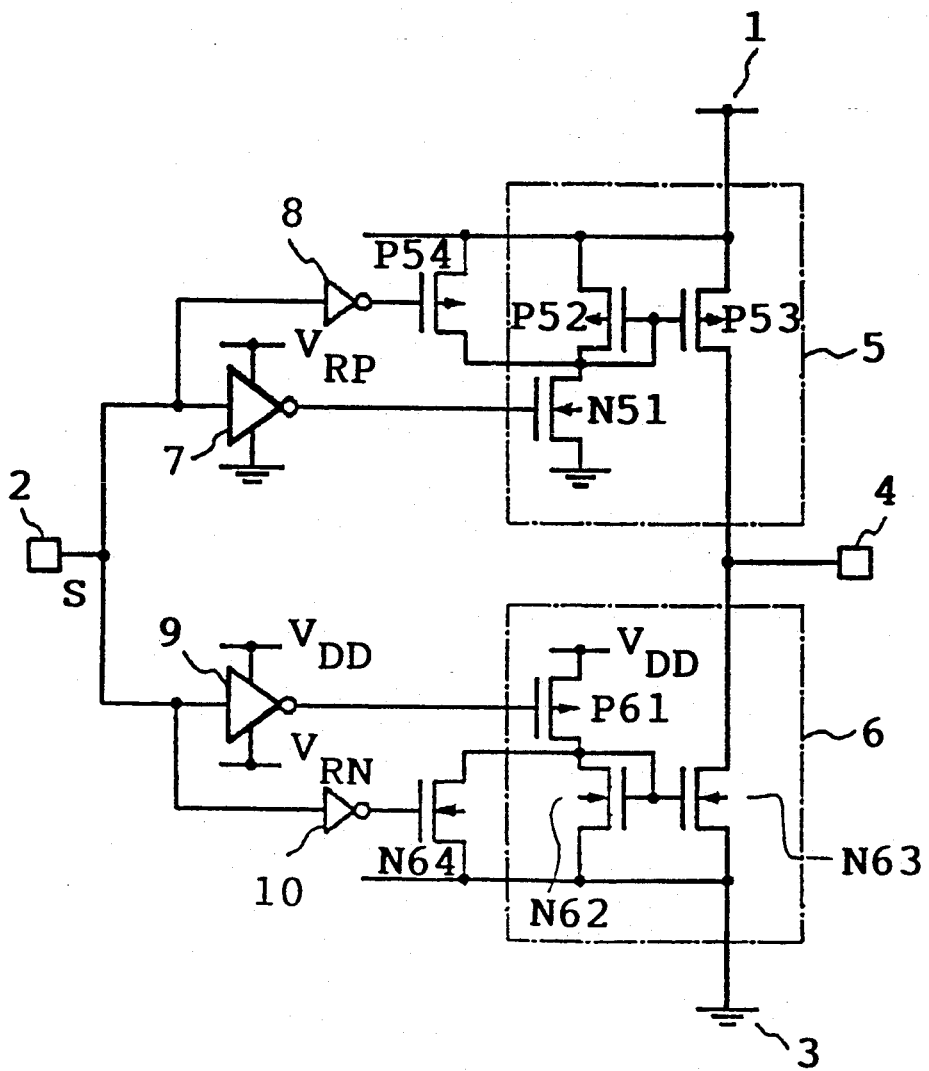
FIG. 2 is a circuit diagram of a novel output circuit of a first embodiment according to the present invention.

A first embodiment according to the present invention will be described with reference to FIG. 2.

The novel output circuit comprises digital signal input and output terminals 2 and 4, first and second mirror currents 5 and 6 and logic circuits for controlling the first and second current mirror circuits 5 and 6. The output circuit is formed between a high potential side power supply line 1 and a low potential side ground line 3 so as to drive the output circuit by a power which is supplied from a power supply through the high potential side power supply line 1. The signal input terminal 2 receives input digital signals for controlling the output circuit. The output terminal 4 through which output signals are delivered is connected to an external load which is driven with the output circuit.

The first current mirror circuit 5 is arranged between the high potential side power supply line 1 which supplies a voltage $V_{DD}$ and the output terminal 4. The first current-mirror circuit 5 comprises an n-type MOS transistor N51 and p-type MOS transistors P52 and P53. The p-type MOS transistor P53 is directly connected at its source side to the high potential side power supply line 1. The p-type MOS transistor P53 is connected at its drain side to the output terminal 4. The p-type MOS transistors P53 and P52 are connected to each other through those gate and source sides. The p-type MOS transistor P52 has a short circuit between its gate and drain sides. The p-type and n-type transistors P52 and N51 are connected to each other through those drain sides. The n-type MOS transistor N51 is grounded at its source side. The gate electrode of the n-type MOS transistor N51 receives digital signals which are supplied from the logic circuit for controlling the first current mirror circuit 5. The n-type MOS transistor N51 serves as a current source in the first current mirror circuit 5.

The logic circuit for controlling the fist current mirror circuit 5 comprises a p-type MOS transistor P54 and invertors 7 and 8. The p-type MOS transistors P54 and P52 are connected to each other through those source and drain sides. The gate electrode of the p-type MOS transistor P54 is connected to an output side of the invertor 8 so as to receive an inverted digital signal from the invertor 8. The invertor 8 is connected at its input side to the input terminal 2 so as to receive and subsequently invert input digital signals from the input terminal 2. The invertor 7 is biased between a ground line and a constant voltage supply line which supplies a constant voltage $V_{RP}$. The invertor 7 is connected at its output side to the gate electrode of the n-type MOS transistor N51 in the current mirror circuit 5.

The second current mirror circuit 6 is arranged between the ground line 3 which supplies the ground potential and the output terminal 4. The second current mirror circuit 6 comprises a p-type MOS transistor P61 and n-type MOS transistors N62 and N63. The n-type MOS transistor N63 is directly connected at its source side to the ground line 3. The n-type MOS transistor N63 is connected at its drain side to the output terminal 4. The n-type MOS transistors N63 and N62 are connected to each other through those gate and source sides. The n-type MOS transistor N62 has a short circuit between its gate and drain sides. The n-type and p-type transistors N62 and P61 are connected to each other through those drain sides. The p-type MOS transistor P61 is connected at its source side to a constant voltage supply line which supplies a constant voltage $V_{DD}$. The gate electrode of the p-type MOS transistor P61 receives digital signals which are supplied from the logic circuit for controlling the second current mirror circuit 6. The p-type MOS transistor P61 serves as a current source in the second current mirror circuit 6.

The logic circuit for controlling the second current mirror circuit 6 comprises an n-type MOS transistor N64 and invertors 9 and 10. The n-type MOS transistors N64 and N62 are connected to each other through those source and drain sides. The gate electrode of the n-type MOS transistor N64 is connected to an output side of the invertor 10 so as to receive an inverted digital signal from the invertor 10. The invertor 10 is connected at its input side to the input terminal 2 so as to receive and subsequently invert input digital signals from the input terminal 2. The invertor 9 is biased between constant voltage supply lines which supply constant voltage $V_{RN}$ and $V_{DD}$ respectively. The invertor 10 is connected at its output side to the gate electrode of the p-type MOS transistor P61 in the current mirror circuit 5.

The operation of the output circuit will be described. When the input terminal 2 receives a high level signal "H", the high level signal "H" is inverted by the invertors 7, 8, 9 and 10 to low level signals "L". The p-type transistors P54 and P61 receive the low level signals and thus turn ON respectively. The n-type transistors N51 and N64 receive the low level signal and thus turn OFF. The gate electrodes of the p-type transistors P53 and P52 receive the high voltage thereby the p-type transistors P53 and P52 take OFF states. The gate electrodes of the n-type transistors N63 and N62 receive the high voltage thereby the n-type transistors N63 and N62 take ON states. The second current mirror circuit 6 is operational so that the source-drain current appears at the n-type MOS transistor N63.

When the input terminal 2 receives a low level signal "L", the low level signal "L" is inverted by the invertors 7, 8, 9 and 10 to high level signals "H". The p-type transistors P54 and P61 receive the high level signals and thus turn OFF respectively. The n-type transistors N51 and N64 receive the high level signal and thus turn ON. The gate electrodes of the p-type transistors P53 and P52 receive the ground potential thereby the p-type transistors P53 and P52 take ON states. The gate electrodes of the n-type transistors N63 and N62 receive the ground potential thereby the n-type transistors N63 and N62 take OFF states. The first current mirror circuit 5 is operational so that the source-drain current appears at the p-type MOS transistor P53.

The transistors on the output stage in the output circuit are the p-type and n-type MOS transistors P53 and N63 only in the first and second current mirror circuits 5 and 6. The number of the transistors on the output stage in the output circuit is reduced to a half of that of the conventional output circuit. As described above, the source-drain current which flows through the transistors P53 and N63 on the output stage are extremely large as compared to those of other transistors. This results in that the channel widths of the transistors P53 and N63 are also extremely large as compared to those of the other transistors. When the output circuit is so designed that source-drain currents of the transistors P53 and N51 are 10 mA and 10 micro-A, the transistors P53 and N51 are so designed that the ratio of channel widths of the transistor P53 to the transistor N51 is 1000:1. It is, hence, apparent that the transistors P53 and N63 require extremely large occupied areas respectively as compared to the other elements in the output circuit. The half reduction of the number of the transistors on the output stage in the output circuit allows an improvement in the high integration of the output circuit in the semiconductor integrated circuit, although the logic circuits are required for controlling the first and second current mirror circuits 5 and 6.

Figure 3:
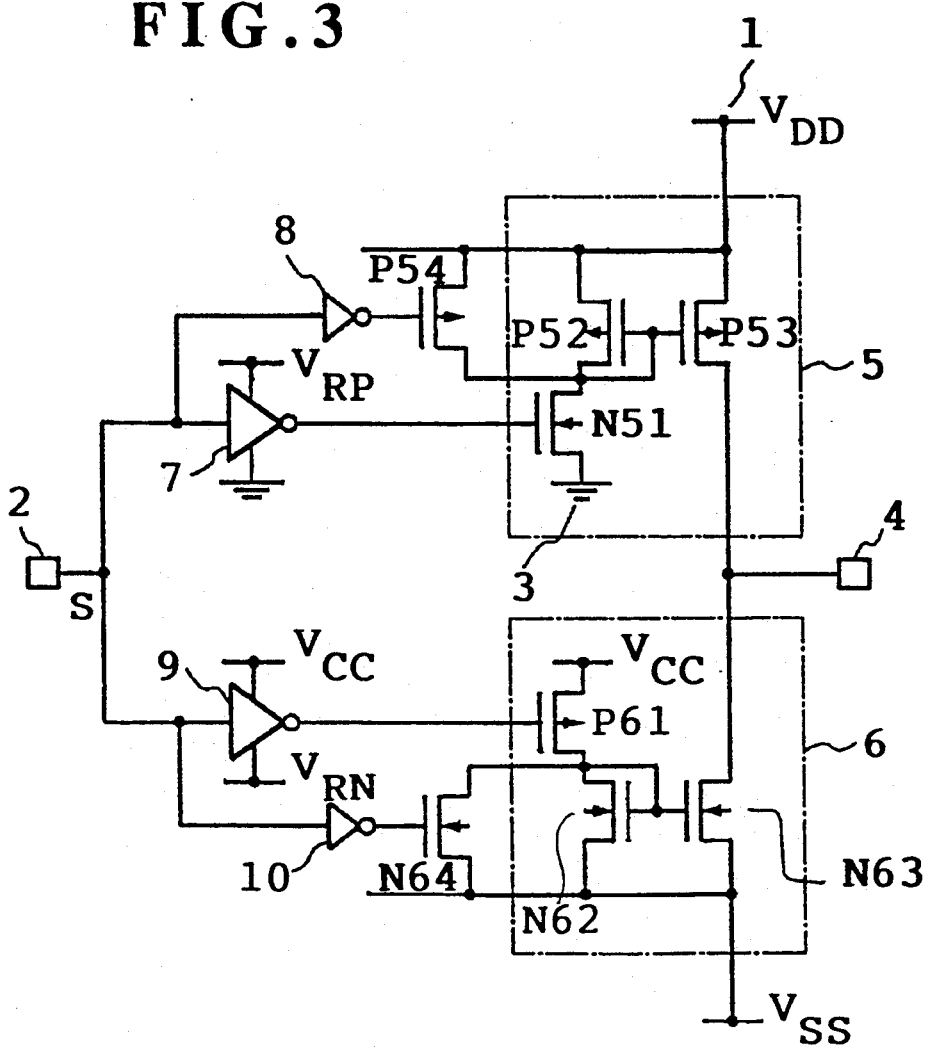
FIG. 3 is a circuit diagram of a novel output circuit of a second embodiment according to the present invention.

A second embodiment according to the present invention will be described with reference to FIG. 3.

In this second embodiment, the output circuit is driven by four power supplies. The output circuit is applicable to an output circuit for driving such a communication device as to be driven in RS232C regulation. The novel output circuit comprises digital signal input and output terminals 2 and 4, first and second mirror currents 5 and 6 and logic circuits for controlling the first and second current mirror circuits 5 and 6. The output circuit is formed between a high voltage supply line 1 which supplies a high voltage $V_{DD}$ of 10 V and a low voltage supply line which supplies a low voltage $V_{SS}$ of −10 V. The signal input terminal 2 receives input digital signals for controlling the output circuit. The output terminal 4 through which output signals are delivered is connected to an external load which is driven with the output circuit.

The first current mirror circuit 5 is arranged between the high voltage supply line 1 and the low voltage supply line. The first current mirror circuit 5 comprises an n-type MOS transistor N51 and p-type MOS transistors P52 and P53. The p-type MOS transistor P53 is directly connected at its source side to the high voltage supply line 1. The p-type MOS transistor P53 is connected at its drain side to the output terminal 4. The p-type MOS transistors P53 and P52 are connected to each other through those gate and source sides. The p-type MOS transistor P52 has a short circuit between its gate and drain sides. The p-type and n-type transistors P52 and N51 are connected to each other through those drain sides. The n-type MOS transistor N51 is grounded at its source side. The gate electrode of the n-type MOS transistor N51 receives digital signals which are supplied from the logic circuit for controlling the first current mirror circuit 5. The n-type MOS transistor N51 serves as a current source in the first current mirror circuit 5.

The logic circuit for controlling the fist current mirror circuit 5 comprises a p-type MOS transistor P54 and invertors 7 and 8. The p-type MOS transistors P54 and P52 are connected to each other through those source and drain sides. The gate electrode of the p-type MOS transistor P54 is connected to an output side of the invertor 8 so as to receive an inverted digital signal from the invertor 8. The invertor 8 is connected at its input side to the input terminal 2 so as to receive and subsequently invert input digital signals from the input terminal 2. The invertor 7 is biased between a ground line and a constant voltage supply line which supplies a constant voltage $V_{RP}$. The invertor 8 is connected at its output side to the gate electrode of the n-type MOS transistor N51 in the current mirror circuit 5.

The second current mirror circuit 6 is arranged between the low voltage supply line which supplies the low voltage $V_{SS}$ and the output terminal 4. The second current mirror circuit 6 comprises a p-type MOS transistor P61 and n-type MOS transistors N62 and N63. The n-type MOS transistor N63 is directly connected at its source side to the low voltage line. The n-type MOS transistor N63 is connected at its drain side to the output terminal 4. The n-type MOS transistors N63 and N62 are connected to each other through those gate and source sides. The n-type MOS transistor N62 has a short circuit between its gate and drain sides. The n-type and p-type transistors N62 and P61 are connected to each other through those drain sides. The p-type MOS transistor P61 is connected at its source side to a constant voltage supply line which supplies a constant voltage $V_{CC}$ of 5 V. The gate electrode of the p-type MOS transistor P61 receives digital signals which are supplied from the logic circuit for controlling the second current mirror circuit 6. The p-type MOS transistor P61 serves as a current source in the second current mirror circuit 6.

The logic circuit for controlling the second current mirror circuit 6 comprises an n-type MOS transistor N64 and invertors 9 and 10. The n-type MOS transistors N64 and N62 are connected to each other through those source and drain sides. The gate electrode of the n-type MOS transistor N64 is connected to an output side of the invertor 10 so as to receive an inverted digital signal from the invertor 10. The invertor 10 is connected at its input side to the input terminal 2 so as to receive and subsequently invert input digital signals from the input terminal 2. The invertor 9 is biased between constant voltage supply lines which supply constant voltage $V_{RN}$ and $V_{CC}$ respectively. The invertor 10 is connected at its output side to the gate electrode of the p-type MOS transistor P61 in the current mirror circuit 5.

The operation of the output circuit will be described. When the input terminal 2 receives a high level signal "H", the high level signal "H" is inverted by the invertors 7, 8, 9 and 10 to low level signals "L". The p-type transistors P54 and P61 receive the low level signals and thus turn ON respectively. The n-type transistors N51 and N64 receive the low level signal and thus turn OFF. The gate electrodes of the p-type transistors P53 and P52 receive the high voltage thereby the p-type transistors P53 and P52 take OFF states. The gate electrodes of the n-type transistors N63 and N62 receive the high voltage thereby the n-type transistors N63 and N62 take ON states. The second current mirror circuit 6 is operational so that the source-drain current appears at the n-type MOS transistor N63.

When the input terminal 2 receives a low level signal "L", the low level signal "L" is inverted by the invertors 7, 8, 9 and 10 to high level signals "H". The p-type transistors P54 and P61 receive the high level signals and thus turn OFF respectively. The n-type transistors N51 and N64 receive the high level signal and thus turn ON. The gate electrodes of the p-type transistors P53 and P52 receive the ground potential thereby the p-type transistors P53 and P52 take ON states. The gate electrodes of the n-type transistors N63 and N62 receive the ground potential thereby the n-type transistors N63 and N62 take OFF states. The first current mirror circuit 5 is operational so that the source-drain current appears at the p-type MOS transistor P53.

The transistors on the output stage in the output circuit are the p-type and n-type MOS transistors P53 and N63 only in the first and second current mirror circuits 5 and 6. The number of the transistors on the output stage in the output circuit is reduced to a half of that of the conventional output circuit. As described above, the source-drain current which flows through the transistors P53 and N63 on the output stage are extremely large as compared to those of other transistors. This results in that the channel widths of the transistors P53 and N63 are also extremely large as compared to those of the other transistors. It is, hence, apparent that the transistors P53 and N63 require extremely large occupied areas respectively as compared to the other elements in the output circuit. The half reduction of the number of the transistors on the output stage in the output circuit allows an improvement in the high integration of the output circuit in the semiconductor integrated circuit, although the logic circuits are required for controlling the first and second current mirror circuits 5 and 6.

Whereas modifications of the present invention will no doubt be apparent to a person having ordinary skill in the art to which the invention pertains, it is to be understood that the embodiments shown and described by way of illustrations are by no means intended to be considered in a limiting sense. Accordingly, it is to be intended by claims to cover all modifications which fall within the sprit and scope of the invention.

What is claimed is:

1. An output circuit in a semiconductor integrated circuit comprising:
   an input terminal for receiving input signals controlling output circuits;
   an output terminal for delivering output signals driving a load device being connected to said output terminal;
   high and low voltage supply lines for supplying high and low voltage driving said output circuit;
   a first current mirror circuit on its output stage including a single transistor being connected between said high voltage supply line and said output terminal;
   a second current mirror circuit on its output stage including a single transistor being connected between said low voltage supply line and said output terminal;
   a first logic circuit being connected between said input terminal and said first current mirror circuit for receiving input signals from said input terminal for a subsequent controlling of said first current mirror circuit; and
   a second logic circuit being connected between said input terminal and said second current mirror circuit for receiving input signals from said input terminal for a subsequent controlling of said second current mirror circuit.

2. The output circuit as claimed in claim 1, wherein said transistors on said output stage in said first and second current mirror circuits are p-type and n-type MOS field effect transistors respectively.

3. The output circuit as claimed in claim 1, wherein said first current mirror circuit comprises:
   a first p-type MOS field effect transistor arranged on said output stage, said first transistor being connected between said high voltage supply line and said output terminal at its source and drain respectively;
   a second p-type MOS field effect transistor being connected at its gate and source to a gate and said source of said first transistor respectively, said second transistor having a short connection between its gate and drain; and
   a third n-type MOS field effect transistor being connected at its drain to said drain of said second transistor, said third transistor being grounded at its source,
   said first logic circuit comprises:
   a fourth p-type MOS field effect transistor being connected at its source and drain to said source and a drain of said second transistor respectively;
   a first invertor being connected at its input side to said input terminal, said first invertor being connected at its output side to a gate of said fourth transistor; and
   a second invertor being connected at its input side to said input terminal, said second invertor being connected at its output side to a gate of said third transistor in said current mirror circuit and said second invertor being biased by a constant voltage supply line and a ground line,
   said second current mirror circuit comprises:
   a fifth n-type MOS field effect transistor arranged on said output stage, said fifth transistor being connected between a low voltage supply line taking a ground potential and said output terminal through its source and drain respectively;
   a sixth n-type MOS field effect transistor being connected at its gate and source to a gate and said source of said fifth transistor respectively, said sixth transistor having a short connection between its gate and drain; and
   a seventh p-type MOS field effect transistor being connected at its drain to said drain of said sixth transistor, said seventh transistor being connected at its source to said high voltage supply line,
   said second logic circuit comprises:
   an eighth n-type MOS field effect transistor being connected at its source and drain to said source and a drain of said sixth transistor respectively;
   a third invertor being connected at its input side to said input terminal, said third invertor being connected at its output side to a gate of said eighth transistor; and
   a fourth invertor being connected at its input side to said input terminal, said fourth invertor being connected at its output side to a gate of said seventh transistor in said current mirror circuit and said fourth invertor being biased by said high voltage supply line and a ground line.

4. The output circuit as claimed in claim 3, wherein said high voltage supply line supplies a voltage of 10 V to said output circuit.

5. The output circuit as claimed in claim 1, wherein said first current mirror circuit comprises:
   a first p-type MOS field effect transistor arranged on said output stage, said first transistor being connected between said high voltage supply line and said output terminal at its source and drain respectively;
   a second p-type MOS field effect transistor being connected at its gate and source to a gate and said source of said first transistor respectively, said second transistor having a short connection between its gate and drain; and
   a third n-type MOS field effect transistor being connected at its drain to said drain of said second transistor, said third transistor being grounded at its source,
   said first logic circuit comprises:
   a fourth p-type MOS field effect transistor being connected at its source and drain to said source and a drain of said second transistor respectively;
   a first invertor being connected at its input side to said input terminal, said first invertor being connected at its output side to a gate of said fourth transistor; and
   a second invertor being connected at its input side to said input terminal, said second invertor being connected at its output side to a gate of said third transistor in said current mirror circuit and said second invertor being biased by a constant voltage supply line and a ground line,
   said second current mirror circuit comprises:
   a fifth n-type MOS field effect transistor arranged on said output stage, said fifth transistor being connected between a low voltage supply line taking an negative potential and said output terminal through its source and drain respectively;

a sixth n-type MOS field effect transistor being connected at its gate and source to a gate and said source of said fifth transistor respectively, said sixth transistor having a short connection between its gate and drain; and a seventh p-type MOS field effect transistor being connected at its drain to said drain of said sixth transistor, said seventh transistor being connected at its source to a positive voltage supply line, said second logic circuit comprises:

an eighth n-type MOS field effect transistor being connected at its source and drain to said source and a drain of said sixth transistor respectively;

a third invertor being connected at its input side to said input terminal, said third invertor being connected at its output side to a gate of said eighth transistor; and a fourth invertor being connected at its input side to said input terminal, said fourth invertor being connected at its output side to a gate of said seventh transistor in said current mirror circuit and said fourth invertor being biased by said positive voltage supply line and said positive voltage supply line.

6. The output circuit as claimed in claim 5, wherein said high voltage supply line supplies a positive voltage of 10 V, said low voltage supply line supplies an negative voltage of −10 V, and said positive voltage supply line supplies a positive voltage of 5 V.

* * * * *